WIDE RANGE VARIABLE FREQUENCY FREE-RUNNING MULTIVIBRATOR
Filed Dec. 19, 1962
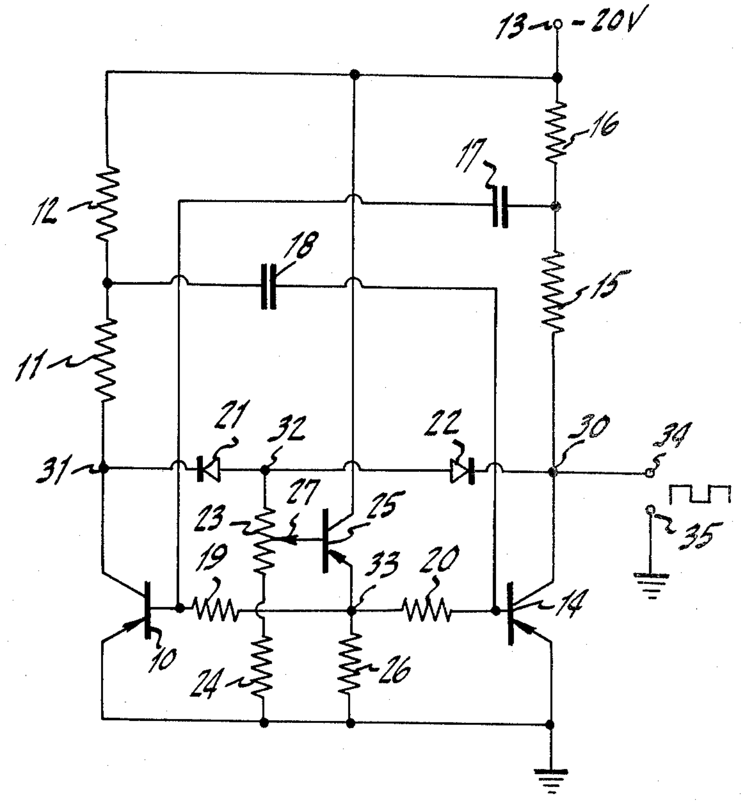
INVENTOR.
LEE V. HEDLUND
BY Edward J. Norton
ATTORNEY 3,222,617

WIDE RANGE VARIABLE FREQUENCY FREE-RUNNING MULTIVIBRATOR

Lee V. Hedlund, Riverton, N.J., assignor to Radio Corporation of America, a corporation of Delaware Filed Dec. 19, 1962, Ser. No. 245,761
7 Claims. (Cl. 331—113)

This invention relates to free-running multivibrators, and particularly to a self-starting, free-running multivibrator tunable over a wide range of frequencies.

The use of self-starting, free-running multivibrators has been limited by two drawbacks in the operation of previously available multivibrators of this type. The frequency determining control means which have been employed with such multivibrators results in the multivibrators being tunable over a small frequency range. In addition, the proper operation of the multivibrators requires that high beta transistors be used, where beta is defined as the collector current divided by the base current.

It is an object of the invention to provide an improved self-starting, free-running multivibrator having an oscillating frequency which is adjustable over a wider range of frequencies than heretofore possible in the operation of self-starting, free-running multivibrators.

Another object of the invention is to provide an improved self-starting, free-running multivibrator in the operation of which a large frequency control can be obtained with the use of low beta transistors in the multivibrator.

The objects are accomplished according to one embodiment of the invention by a circuit arrangement including first and second semiconductor junction transistor devices of the same type of conductivity. The transistors are connected as common emitter transistor stages with the respective base and collector electrodes interconnected by a frequency determining control circuit so that the transistors operate as a frequency controllable, free-running multivibrator.

The present invention includes a frequency determining control circuit arranged to provide for the self-starting of the multivibrator and at the same time to include for the operation of the control circuit a point at which substantially the full power supply voltage of the multivibrator appears. By providing in the control circuit a voltage source which permits the selection of an operating voltage for the control circuit up to and including substantially the full power supply voltage of the multivibrator, a wide tuning range for the operating frequency of the multivibrator is achieved. A feature of the invention is the use of a third semiconductor junction device connected as an emitter follower stage in the control circuit to provide direct current gain and a low driving point impedance to the base electrode resistors of the first and second transistors. This construction provides a self-starting, free-running multivibrator in which low beta, inexpensive transistors can be used for the multivibrator with the operating frequency of the multivibrator being controllable over a wide range of frequencies, for example, approximately a three and one half to one frequency range.

The invention will be described in greater detail by reference to the single figure of the drawing which comprises a schematic circuit diagram of a preferred embodiment thereof.

Referring to the drawing, a PNP junction transistor 10 includes an emitter electrode connected to a point of reference potential such as ground and a collector electrode connected through resistors 11 and 12 to the negative terminal 13 of a source of unidirectional potential, for example, —20 v. A second PNP junction transistor 14 includes an emitter electrode connected to the point of reference potential and a collector electrode connected through resistors 15 and 16 to the negative terminal 13. A capacitor 17 is connected between the base electrode of transistor 10 and the junction of resistors 15, 16. A second capacitor 18 is connected between the base electrode of transistor 14 and the junction of resistors 11, 12. The base electrode of transistor 10 is connected to the base electrode of transistor 14 through resistors 19 and 20.

A unidirectional current conducting device shown as a crystal diode 21, poled for current conduction in the direction of the arrow, includes a cathode connected to the collector electrode of transistor 10. The cathode of a second unidirectional current conducting device shown as a crystal diode 22, poled for current conduction in the direction of the arrow, is connected to the collector electrode of transistor 14. The anodes of the diodes 21, 22 are connected together and to the point of reference potential through resistors 23 and 24. The total resistance value of resistors 23, 24 is much larger than the total resistance value of resistors 11 and 12 or resistors 15 and 16.

A variable tap or wiper arm 27 on the resistor 23 is connected to the base electrode of a third PNP junction transistor 25. The collector electrode of the transistor 25 is connected to the negative terminal 13, and the emitter electrode of transistor 25 is connected to the junction of resistors 19 and 20. A resistor 26 for determining the proper current conduction level of the transistor 25 is connected between the junction of the resistors 19, 20 and the point of reference potential. An output circuit in the form of a pair of output terminals 34, 35 is shown for deriving the square wave signal from the collector electrode of transistor 14. In practice, an output can be taken from any one of the electrodes of either transistor 10 or 14 in a known manner.

In describing the operation of the multivibrator, it will be assumed that power is first applied. It is possible that both transistor 10 and transistor 14 will attempt to conduct and reach saturation simultaneously. In this condition, point 31 at the junction of diode 21 and the collector electrode of transistor 10 and point 30 at the junction of diode 22 and the collector electrode of transistor 14 will both be driven toward the ground potential, or positive-going, causing both diodes 21 and 22 to be non-conducting. The emitter voltage of transistor 25 at point 33 becomes correspondingly less engative, reducing the base driving current to transistors 10 and 14. Transistors 10 and 14 are both driven toward cut-off. It is impossible for both transistors 10 and 14 to reach saturation simultaneously which would prevent the starting of the free-running operation of the multivibrator.

Assuming for the moment that the above operation has resulted in transistors 10 and 14 both being substantially cut-off or non-conducting, the differences in transistor characteristics, as well as imbalances in the circuit parameters of the multivibrator, results in one of the transistors 10 or 14 becoming conducting more rapidly than the other transistor. It will be assumed that transistor 14 starts to conduct. Point 30 becomes less negative than point 31. The cathode of diode 22 is biased positive with respect to its anode, and diode 22 is held non-conducting. At the same time, the cathode of diode 21 is biased negative with respect to its anode, and diode 21 conducts. By making the resistance of the voltage divider 23 and 24 considerably larger than the resistance of resistors 11 and 12 or resistors 15 and 16, substantially the full supply voltage appears at point 32. Transistor 25 conducts at a level determined by the setting of wiper arm 27 and the value of resistor 26, resulting in a negative voltage appearing at the point 33 or emitter electrode of transistor 25.

Since transistor 25 is connected as an emitter follower, the voltage at point 33 will be of the same polarity as the base voltage of transistor 25 and of a value determined by the setting of the wiper arm 27. A base driving current is provided by the base resistor 20 to transistor 14. As transistor 14 approaches saturation, the junction of resistors 15 and 16 becomes less negative. The base bias voltage appearing at the base electrode of transistor 10 by the operation of capacitor 17 causes the emitter-base diode of transistor 10 to be increasingly biased in the reverse or non-conducting direction. Transistor 10 is held non-conducting. The junction of resistors 11 and 12 is negative-going, resulting in a negative bias voltage being coupled to the base electrode of transistor 14 by capacitor 18, assisting in the holding of transistor 14 in a conducting state. Transistor 14 is now conducting, and transistor 10 is cut-off or non-conducting. The output signal appearing across terminals 34, 35 becomes first positive-going and then remains constant at a level determined by the current conducting characteristics of transistor 14 and the associated circuit parameters.

While the above operation has been described in steps for purposes of a clear understanding, it is to be understood that, in practice, the action described occurs almost instantaneously. Immediately upon power being applied to the multivibrator, one of the transistors 10 or 14 becomes conducting and the other non-conducting. Diodes 21, 22 assure that only one of the transistors 10 or 14 becomes conducting.

The manner in which the multivibrator is started has been considered. Transistor 14 is assumed to be conducting, and transistor 10 is non-conducting. During the period in which transistor 14 becomes conducting, the increasing positive-going voltage coupled through capacitor 17 to reverse bias the base electrode of transistor 10 results in capacitor 17 being charged positively with respect to the base electrode of transistor 10. The operation by which transistor 14 becomes conducting occurs so rapidly that capacitor 17 does not get a chance to discharge. After transistor 14 has become conducting, the collector current and collector voltage of transistor 14 remain constant. Capacitor 17 now discharges over the path including base resistor 19 and the point 33. The rate of discharge is a direct function of the level of the negative voltage appearing at point 33 and, therefore, the setting of the wiper arm 27. The reverse bias on the base electrode of transistor 10 is decreaesd. The base bias voltage passes through zero volts and becomes negative. The emitter voltage of transistor 10 becomes positive with respect to the base voltage, and the emitter is biased in the forward or current conducting direction with respect to the base. Transistor 10 conducts.

As the collector current of transistor 10 increases, the collector voltage becomes less negative or more positive. This changing voltage is coupled through capacitor 18 to the base electrode of transistor 14. The base electrode of transistor 14 is driven in a positive direction and causes a decrease in the current flow through transistor 14. The resulting increased negative voltage at the junction of resistors 15 and 16 is coupled through capacitor 17 to the base electrode of transistor 10, further biasing the emitter-base diode of transistor 10 in the forward direction. The collector current of transistor 10 increases. This action continues rapidly until transistor 10 is conducting or saturated and transistor 14 is non-conducting or cut-off. Point 30 becomes negative with respect to point 31, causing diode 21 to be non-conducting and diode 22 to be conducting. Again, a negative voltage at substantially the full power supply voltage appears at point 32, and a negative voltage of a value determined by the setting of wiper arm 27 appears at the emitter electrode of transistor 25 or point 33. The operation by which the conducting states of transistors 10 and 14 are reversed occurs very rapidly. The output signal appearing across terminals 34, 35 first becomes negative-going and then remains constant at a level determined by the voltage applied to terminal 13 and the associated circuit parameters.

Transistor 14 remains cut-off, and transistor 10 remains conducting until capacitor 18 discharges sufficiently over the path including base resistor 20 and point 33 to cause the base electrode of transistor 14 to be forward biased. The rate of discharge is again a direct function of the level of the negative voltage at point 33 and, therefore, the setting of wiper arm 27. Transistor 14 conducts. As the collector current of transistor 14 increases, the collector voltage of transistor 14 becomes less negative or more positive. This voltage appearing at the junction of resistors 15, 16 and coupled through capacitor 17 to the base electrode of transistor 10, drives the base of transistor 10 more positive and causes a decrease in the current flow through transistor 10. The resulting increased negative voltage at the collector of transistor 10 is coupled through capacitor 18 to the base electrode of transistor 14. The collector current of transistor 14 increases. This process continues rapidly until transistor 14 is saturated and transistor 10 is cut-off. Diode 21 becomes conducting, and diode 22 becomes non-conducting. The output signal appearing across terminals 34 and 35 becomes first positive-going and then remains constant for the duration of the period in which transistor 14 is conducting. Transistor 14 remains conducting and transistor 10 remains non-conducting until capacitor 17 discharges sufficiently over the path including the base resistor 19 and point 33 to permit transistor 10 to conduct. The cycle is repeated as above.

The operating frequency of the multivibrator is determined by the values of capacitors 17 and 18, resistors 19 and 20, the level of the voltage at point 33, and the level of the voltage at the junction of resistors 11, 12 and resistors 15, 16. When wiper arm 27 is at the upper-most end of resistor 23, providing at point 33 the highest negative voltage producible from the voltage divider including resistors 23, 24 and resistors 11, 12 or 15, 16, the multivibrator frequency is at the high end of the range of frequencies over which the multivibrator is tunable. This is true since the negative voltage level at point 33 results in the most rapid discharge rate of capacitors 17 and 18. When wiper arm 27 is at the lower-most end of resistor 23, providing at point 33 the least negative voltage producible from the voltage divider 23, 24 and resistors 11, 12 or 15, 16, there results a correspondingly slower discharge rate for capacitors 17 and 18. The operating frequency of the multivibrator is at the lower end of the frequency range over which the multivibrator is tunable.

By the construction of the invention, point 32 can be provided at which substantially the full power supply voltage of the multivibrator appears for the operation of the frequency determining control circuit. This is in contrast to prior art arrangements where the tuning of a self-starting, free-running multivibrator was based on a voltage supply of less than one-half the multivibrator supply voltage. The present invention provides for use with the control circuit a greatly increased voltage supply, while at the same time maintaining the self-starting feature of the multivibrator. By increasing the range over which the voltage supply for the frequency determining control circuit of the multivibrator can be controlled, the multivibrator is tunable over a correspondingly wider range of frequencies.

A regenerative feedback with amplification is required for the oscillation of a free-running multivibrator. In order to provide the necessary amplification, the low base driving current typically found in free-running multivibrators previously known required that high beta transistors be used, where beta is defined as the collector current divided by the base current. High beta transistors tend to be expensive and present various disadvantages in their application in a practical circuit.

This drawback is avoided in the present free-running multivibrator by the use of the emitter-follower transistor 25. Transistor 25 serves to provide a direct current gain with a corresponding increase in the base driving current to transistors 10 and 14. By increasing the base current, a correspondingly lower beta transistor is required to provide the desired collector current. By determining the proper value of the emitter resistor 26 to be used in association with the other circuit component values, transistor 25 provides a direct current gain and a low driving point impedance to the two base resistors 19 and 20. Proper operation of the multivibrator allows the use of low beta transistors for the transistors 10 and 14.

Reference has been made to the use of the resistor 26 to provide the proper bias to the emitter electrode of transistor 25 to cause transistor 25 to operate at the appropriate direct current conduction level. In practice, resistor 26 can be entirely omitted if the base resistors 19 and 20 provide sufficient current drain for the transistor 25 to be at the desired current conduction level.

By way of example, a free-running multivibrator constructed according to the embodiment shown in the single figure of the drawing for operation over a frequency range of approximately 5 to 18 kc. includes components having the following values:

| | |
|---|---|
| Resistors **11, 12** ----------ohms-- | 1.1K |
| Resistors **15, 16** ----------do---- | 1.1K |
| Resistors **19, 20** ----------do---- | 10K |
| Resistor **23** ----------do---- | 50K |
| Resistor **24** ----------do---- | 1K |
| Resistor **26** ----------do---- | 10K |
| Capacitors **17, 18** ----------micromicrofarads-- | 6200 |
| Transistors **10, 14, 25** ---------- | 2N404 |
| Diodes **21, 22** (germanium) ---------- | 1N100 |

What is claimed is:

1. A self-starting, free-running multivibrator comprising, first and second transistors each having base, emitter and collector electrodes, first, second, third and fourth resistors, means to connect said first and second resistors in series between the collector electrode of said first transistor and a source of unidirectional potential, means to connect said third and fourth resistors in series between the collector electrode of said second transistor and said source of unidirectional potential, a first capacitor connected between the base electrode of said second transistor and the junction of said first and second resistors, a second capacitor connected between the base electrode of said first transistor and the junction of said third and fourth resistors, fifth and sixth resistors connected in series between the base electrodes of said first and second transistors, first and second crystal diodes each having cathode and anode electrodes, means connecting said diodes in series between the collector electrodes of said first and second transistors with similar electrodes of said diodes being connected together at the junction of said diodes, means to connect the emitter electrodes of said first and second transistors to a point of reference potential, a seventh resistor having a movable wiper arm thereon and of a resistance value larger than that of said first and second resistors combined and said third and fourth resistors combined, means to connect one end of said seventh resistor to said junction of said first and second diodes and to connect the other end of said seventh resistor to said point of reference potential, and means to provide a connection between said wiper arm and the junction of said fifth and sixth resistors.

2. A self-starting, free-running multivibrator comprising, first, second and third transistors of the same type of conductivity and each having base, emitter and collector electrodes, first, second, third and fourth resistors, means to connect said first and second resistors in series between the collector electrode of said first transistor and a source of unidirectional potential, means to connect said third and fourth resistors in series between the collector electrode of said second transistor and said source of unidirectional potential, a first capacitor connected between the base electrode of said second transistor and the junction of said first and second resistors, a second capacitor connected between the base electrode of said first transistor and the junction of said third and fourth resistors, fifth and sixth resistors connected in series between the base electrodes of said first and second transistors, first and second crystal diodes each having cathode and anode electrodes, means connecting said diodes in series between the collector electrodes of said first and second transistors with similar electrodes of said diodes being connected together at the junction of said diodes, means to connect the emitter electrodes of said first and second transistors to a point of reference potential, a seventh resistor having a movable wiper arm thereon and of a resistance value larger than the resistance value of said first and second resistors combined and the resistance value of said third and fourth resistors combined, means to connect one end of said seventh resistor to said junction of said first and second diodes and to connect the other end of said seventh resistor to said point of reference potential, means to connect the collector electrode of said third transistor to said source of unidirectional potential and the emitter electrode of said third transistor to the junction of said fifth and sixth resistors, and means to connect the base electrode of said third transistor to said wiper arm.

3. A self-starting, free-running multivibrator comprising, first, second, and third PNP transistors each having base, emitter and collector electrodes, first, second, third and fourth resistors, means to connect said first and second resistors in series between the collector electrode of said first transistor and a source of negative unidirectional potential, means to connect said third and fourth resistors in series between the collector electrode of said second transistor and said source of negative unidirectional potential, a first capacitor connected between the base electrode of said second transistor and the junction of said first and second resistors, a second capacitor connected between the base electrode of said first transistor and the junction of said third and fourth resistors, means to connect the emitter electrodes of said first and second transistors to a point of reference potential, fifth and sixth resistors connected in series between the base electrodes of said first and second transistors, first and second crystal diodes each having a cathode and an anode, means to connect the cathode of said first diode directly to the collector electrode of said first transistor and the cathode of said second diode directly to the collector electrode of said second transistor, a seventh resistor having a movable wiper arm thereon and of a resistance value larger than that of said first and second resistors combined and said third and fourth resistors combined, means to connect one end of said seventh resistor directly to the anodes of said first and second diodes and to connect the other end of said seventh resistor to said point of reference potential, means to connect the collector electrode of said third transistor to said source of negative unidirectional potential and to connect the emitter electrode of said third transistor to the junction of said fifth and sixth resistors, and means to connect the base electrode of said third transistor to said wiper arm on said seventh resistor, the value of said seventh resistor being determined with relation to that of said first, second, third and fourth resistors to cause a voltage substantially up to the full power supply voltage of said multivibrator to appear at the junction of said fifth and sixth resistors with said third transistor providing direct current gain in the base driving circuit of said first and second transistors.

4. A free-running multivibrator comprising, in combination, first and second transistors each having input, output and common electrode circuits, means connected between said common and output electrode circuits of said first transistor and between said common and output electrode circuits of said second transistor for applying operating potentials to said transistors, first and second resistors connected in series between said input electrode circuits of said transistors, first and second unidirectional current conducting devices each including first and second electrodes, means connecting said devices in series opposition between said output electrode circuits of said transistors with said first electrodes of said devices each individually connected to a respective one of said output electrode circuits, a third resistor having a variable tap and connected at one end to the junction of said second electrodes of said devices and at the other end to said common electrode circuits of said transistors, means connecting said variable tap on said third resistor to the junction of said first and second resistors, and means including a pair of capacitors each individually coupled between the output electrode circuit of one of said transistors and the input electrode circuit of the other of said transistors for driving each of said transistors to the current conducting state opposite to that of the other of said transistors.

5. A free-running multivibrator comprising, in combination, first and second transistors each having base, collector and emitter electrodes, means connected to said emitter electrodes and to said collector electrodes for applying operating potentials to said first and second transistors, a first resistor connected between said base electrodes of said first and second transistors, first and second unidirectional current conducting devices each including first and second electrodes, means connecting said devices in series opposition between said collector electrodes of said transistors with said first electrodes of said devices each individually connected to a respective one of said collector electrodes, a second resistor having a variable tap and connected at one end to the junction of said second electrodes of said devices and at the other end to said emitter electrodes, means connecting said variable tap to a point on said first resistor intermediate the ends of said first resistor, and means including a pair of capacitors each individually coupled between the collector electrode of one of said transistors and the base electrode of the other of said transistors for driving each of said transistors into the current conducting state opposite to that of the other of said transistors.

6. In combination, a first transistor having first, second and third electrodes, a second transistor having first, second and third electrodes corresponding to said respective first, second and third electrodes of said first transistor, means connected to said first electrodes and to said second electrodes for applying operating potentials to said first and second transistors, a first resistor connected between said third electrodes of said first and second transistors, first and second unidirectional current conducting devices each including first and second electrodes, means connecting said devices in series opposition between said second electrodes of said transistors with said first electrodes of said devices each individually connected to a respective one of said second electrodes of said transistors and said second electrodes of said devices directly connected together, a second resistor connected at one end directly to the junction of said second electrodes of said devices and at the other end to said first electrodes of said transistors, means connecting a point on said second resistor intermediate the ends of said second resistor to a point on said first resistor intermediate the ends of said first resistor, and means coupling said third electrode of said first transistor to said second electrode of said second transistor and said third electrode of said second transistor to said second electrode of said first transistor for driving each of said transistors into the current conducting state opposite to that of the other of said transistors.

7. A self-starting free-running multivibrator as claimed in claim 2 and comprising, an eighth resistor connected at one end to the junction of said fifth and sixth resistors and at the other end to a point of reference potential.

References Cited by the Examiner

UNITED STATES PATENTS

| | | | |
|---|---|---|---|
| 2,900,606 | 8/1959 | Faulkner | 331—113 |
| 3,037,171 | 5/1962 | Cerofolini | 331—113 X |

ROY LAKE, *Primary Examiner.*

JOHN KOMINSKI, *Examiner.*